(12) United States Patent
Minzoni

(10) Patent No.: US 7,113,010 B2
(45) Date of Patent: Sep. 26, 2006

(54) CLOCK DISTORTION DETECTOR USING A SYNCHRONOUS MIRROR DELAY CIRCUIT

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 181 days.

(21) Appl. No.: 10/809,826

(22) Filed: Mar. 26, 2004

(65) Prior Publication Data
US 2005/0212573 A1  Sep. 29, 2005

(51) Int. Cl.
*H03L 7/00* (2006.01)

(52) U.S. Cl. ...................................... 327/144; 327/153

(58) Field of Classification Search ................ 327/144, 327/153, 158, 161, 277; 365/233
See application file for complete search history.

(56) References Cited

U.S. PATENT DOCUMENTS 6,727,740 B1 *  4/2004  Kirsch .......................... 327/161
6,798,259 B1 *  9/2004  Lin .............................. 327/153

* cited by examiner

*Primary Examiner*—Linh My Nguyen
(74) *Attorney, Agent, or Firm*—Morrison & Foerster LLP

(57) ABSTRACT

The invention refers to a clock distortion detection method, and a clock distortion detector including a first input for receiving a first clock signal, a second input for receiving a second clock signal, and at least one mirror delay element.

17 Claims, 3 Drawing Sheets

US 7,113,010 B2

CLOCK DISTORTION DETECTOR USING A SYNCHRONOUS MIRROR DELAY CIRCUIT

TECHNICAL FIELD OF THE INVENTION

The invention refers to a clock distortion detector, and to a clock distortion detection method.

BACKGROUND OF THE INVENTION

In semi-conductor components, e.g. memory components such as DRAMs (DRAM=Dynamic Random Access Memory and/or dynamic read/write memory) based on CMOS technology, so-called clock signals are used for the chronological co-ordination of the processing and/or relaying of data.

Conventional semi-conductor components use a "single-ended" clock signal CLK, present on a single line, for this purpose.

The data may then for instance be processed/relayed at respective rising edges of the single-ended clock signal (or alternatively at respective falling edges of the single-ended clock signal).

Further, so-called DDR components, e.g. DDR-DRAMs (DDR-DRAM=double data rate DRAM and/or DRAM with a double data rate) are already well known.

In DDR-DRAMs—instead of one "single ended" clock signal CLK—two differential, inverse clock signals CLK and BCLK present on two separate lines are used.

Every time, for instance, when the first of the two clock signals changes e.g. from a logic "high" state (e.g. a high voltage level) to e.g. a logic "low" state (e.g. a low voltage level), the second clock signal—essentially simultaneously—changes its state from logic "low" to logic "high" (e.g. from a low to a high voltage level).

Conversely, whenever the first clock signal changes from a logic "low" state (e.g. from a low voltage level) to a logic "high" state (e.g. a high voltage level), the second clock signal (again essentially simultaneously) changes its state from logic "high" to logic "low" (e.g. from a high to a low voltage level).

With DDR-DRAMs, data may be processed/relayed both at respective rising, and at respective falling edges of the clock signals.

This means that data is processed/relayed more frequently and/or faster (more particularly, twice as frequently and/or twice as fast) with a DDR-DRAM using differential, inverse clock signals, than with a corresponding conventional DRAM using a "single ended" clock signal; in other words the data rate of DDR-DRAMs is twice as high as that of corresponding DRAMs.

In conventional systems, the respective single ended clock signal CLK (or the respective differential clock signals CLK, BCLK) are generated by a respective—external—clock generating device, and transmitted to the respective semi-conductor component(s), e.g. a DRAM, a DDR-DRAM, etc.

The respective component comprises a means, e.g. a respective DLL-circuit (DLL=Delay Locked Loop), for generating the respective—internal—clock signal(s) DQS (or DQS/BDQS) ("data strobe" signal(s)) out of the—external—clock signal(s) CLK (or CLK/BCLK) provided by the external clock generating device.

The—internally used—DQS- (or DQS-/BDQS-) signal(s) need to be synchronized with the—external—CLK- (or CLK-/BCLK-) signal(s), e.g., the falling and rising edges of the DQS- (or DQS-/BDQS-) signal(s) provided by the DLL-circuit should e.g. occur at the same time as respective falling and rising edges of the CLK- (or CLK-/BCLK-) signal(s) provided by the external clock generating device.

Problems might arise if—due to distortions—e.g. the time Th the CLK signal—when received by the respective component, e.g. DRAM/DDR-DRAM—is logic "high" (and the BCLK signal is logic "low") is longer than the time T1 the CLk signal is logic "low" (and the BCLK signal is logic "high"), or the other way round ("clock distortion").

SUMMARY OF THE INVENTION

The invention discloses a novel clock distortion detector, and a novel clock distortion detection method.

According to one embodiment of the invention, a clock distortion detector includes:
 a first input for receiving a first clock signal;
 a second input for receiving a second clock signal; and
at least one mirror delay element.
 Advantageously, the clock distortion detector includes:
  a first mirror delay element, comprising two inputs and two outputs;
  a second mirror delay element, comprising two inputs and two outputs;

wherein a second output of the first mirror delay element is coupled with a first input of the second mirror delay element, and wherein a first output of the second mirror delay element is coupled with a second input of the first mirror delay element.

According to another embodiment of the invention, a clock distortion detection method includes:
 applying a clock signal to a control input of a first mirror delay element;
 applying the clock signal to a control input of a second mirror delay element;
 wherein a signal output by the first mirror delay element is applied to the second mirror delay element, and a signal output by the second mirror delay element is applied to the first mirror delay element.

BRIEF DESCRIPTION OF THE DRAWINGS

These and other features, aspects and advantages of the present invention will be more fully understood when considered with respect to the following detailed description and accompanying drawings, wherein.

DETAILED DESCRIPTION OF THE INVENTION

Figure 1:
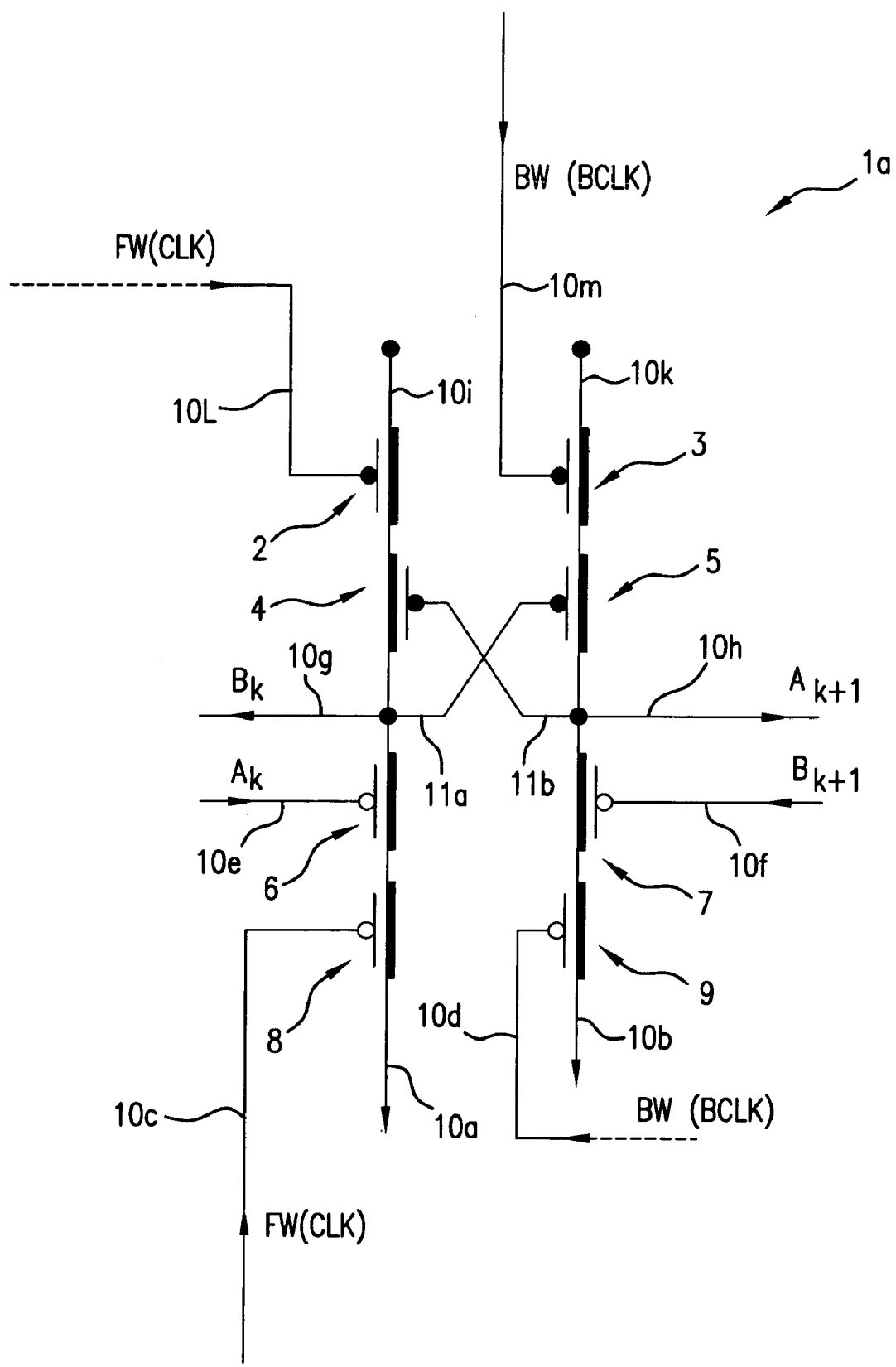
FIG. 1 is an exemplary circuit diagram of a synchronous mirror delay element used in an embodiment of the invention.

FIG. 1 shows a circuit diagram of a synchronous mirror delay element 1a as used in an embodiment of the invention.

As can be seen in FIG. 1, the synchronous mirror delay element 1a comprises several (in this example: eight) transistors 2, 3, 4, 5, 6, 7, 8, 9, here: four p-channel MOSFETs 2, 3, 4, 5, and four n-channel MOSFETS 6, 7, 8, 9.

The source of the MOSFET 8, and the source of the MOSFET 9 are—via respective lines 10a, 10b—coupled to ground.

The gate of the MOSFET 8 is connected with a line 10c, on which—as will be explained in further detail below—a "forward" control signal (FW-signal) is present (in the described embodiment, and as will be explained later, a clock-signal (CLK) is used as the above "forward" control signal (FW-signal)).

Correspondingly, the gate of the MOSFET 9 is connected with a line 1d, on which—as will be explained in further detail below—a "backward" control signal (BW-signal) is present (in the described embodiment, and as will be explained later, an inverse clock-signal (BCLK) is used as the above "backward" control signal (BW-signal)).

As can be seen from FIG. 1, the drain of the MOSFET 8 is connected with the source of the MOSFET 6, and the drain of the MOSFET 9 is connected with the source of the MOSFET 7.

Further, the gate of the MOSFET 6 is connected to a line 10e, on which—as will be described below—a k-th (forward) input signal $A_k$ might be present.

Correspondingly, the gate of the MOSFET 7 is connected to a line 10f, on which—as will be described below—a (k+1)-th (backward) input signal $B_{k+1}$ might be present.

Still further, according to FIG. 1, the drain of the MOSFET 6 is connected with the drain of the MOSFET 4, and the drain of the MOSFET 7 is connected with the drain of the MOSFET 5.

In addition, the drain of the MOSFET 6 is connected to a line 10g (on which—as will be described below—a k-th (backward) output signal $B_k$ might be present), and—via a line 11a—to the gate of the MOSFET 5.

Correspondingly, in addition, the drain of the MOSFET 7 is connected to a line 10h (on which—as will be described below—a (k+1)-th (forward) output signal $A_{k+1}$ might be present), and—via a line 11b—to the gate of the MOSFET 4 (hence, the MOSFETS 4 and 5 are cross-coupled).

The source of the MOSFET 4 is coupled to the drain of the MOSFET 2, and the source of the MOSFET 5 is coupled to the drain of the MOSFET 3.

Further, the source of the MOSFET 2—via a line 10i—is coupled to a respective supply voltage.

The gate of the MOSFET 2 is connected with a line 101, on which—similar to what is the case for the above line 10c—the above "forward" control signal (FW-signal) is present (in this example: the CLK-signal) (for this purpose, the line 101 might be connected with the line 10c (not shown in FIG. 1)).

Correspondingly, the gate of the MOSFET 3 is connected with a line 10m, on which—similar to what is the case for the above line 10d—the above "backward" control signal (BW-signal) is present (in this example: the signal BCLK) (for this purpose, the line 10d might be connected with the line 10m (not shown in FIG. 1)).

The synchronous mirror delay element 1a, depending on the state of the control signals (signals FW and BW (in this example: the signals CLK and BCLK)), either—in a forward direction—propagates the input signal $A_k$ present on the (input) line 10e to the (output) line 10h (such that,—after a certain delay $\Delta T$ (see e.g. as well FIG. 4)—a positive edge of the (forward) input signal $A_k$ leads to a corresponding positive edge of the (forward) output signal $A_{k+1}$), or—in a backward direction—propagates the input signal $B_{k+1}$ present on the (input) line 10f to the (output) line 10g (such that,—after a certain delay (again, $\Delta T$)—a positive edge of the (backward) input signal $B_{k+1}$ leads to a corresponding positive edge of the (backward) output signal $B_k$).

In further detail, as long as the (forward) control signal FW (in this case: CLK) is "logic high", and the (backward) control signal BW (in this case: BCLK) is "logic low", the synchronous mirror delay element 1a—in a forward direction, and after the above delay $\Delta T$—propagates the input signal $A_k$ to the (output) line 10h (signal $A_{k+1}$).

As soon as the (forward) control signal FW (in this case: CLK) gets "logic low", and the (backward) control signal BW (here: BCLK) gets "logic high", the synchronous mirror delay element 1a propagates the signals in an opposite, backward direction (such that—after the above delay $\Delta T$—the input signal $B_{k+1}$ is—in backward direction—propagated to the (output) line 10g (signal $B_k$)).

Figure 2:
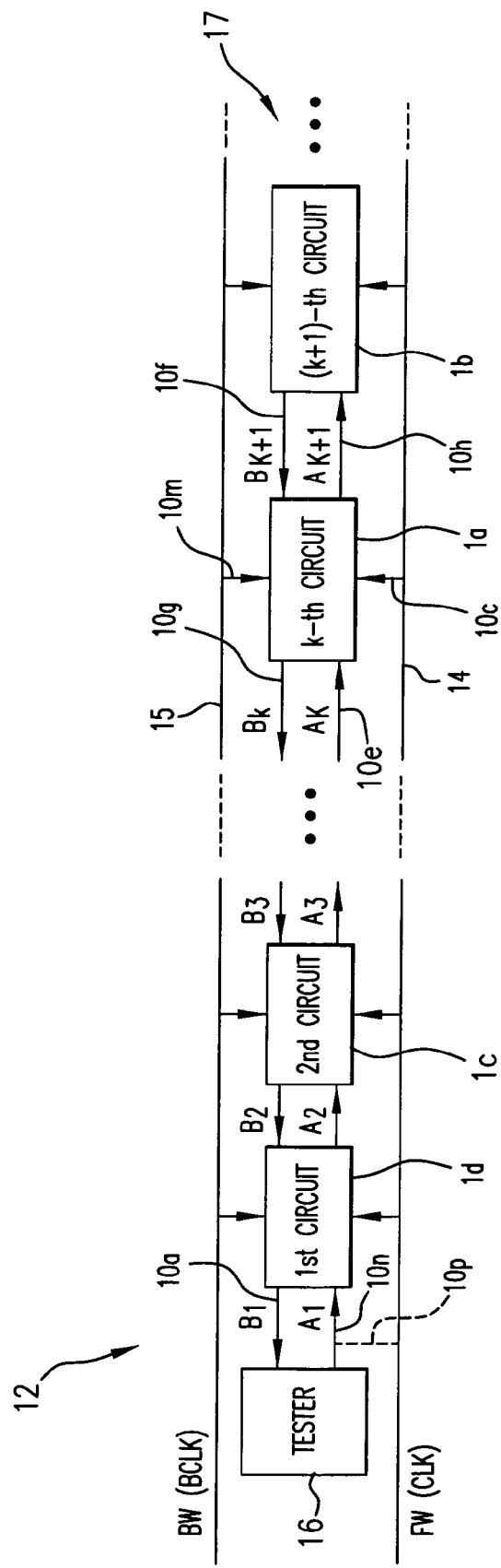
FIG. 2 is a block diagram of a clock distortion detector used in the embodiment of the invention, which comprises several synchronous mirror delay elements as shown in FIG. 1.

FIG. 2 is a simplified, schematic block diagram of a clock distortion detector 12 according to the described embodiment of the invention.

As is shown in FIG. 2, the clock distortion detector 12 comprises a plurality of synchronous mirror delay elements 1a, 1b, 1c, 1d, etc. (in particular, e.g., more than three, five or ten respective elements 1a, 1b, 1c, 1d, here: a first element 1d, a second element 1c, ... a k-th element 1a, etc.), each built similarly to the synchronous mirror delay element 1a as shown in FIG. 1 (here used as k-th element).

As—by way of example—described with respect to the k-th element 1a, the (forward) output signal $A_{k+1}$ of each respective element 1a (e.g. output on a respective line 10h) is used as a corresponding (forward) input signal for the next element (e.g., the (k+1)-th element 1b).

Further, the (backward) output signal $B_k$ of each respective element 1a (e.g. output on a respective line 10g) is used as a corresponding (backward) input signal for the previous element (e.g., with respect to the k-th element 1a, for the (k−1)-th element).

In addition, for each respective element 1a, as a (forward) input signal $A_k$ (e.g. input on a respective line 10e), the corresponding (forward) output signal of the previous element (e.g., the (k−1)-th element) is used.

Still further, for each respective element 1a, as a (backward) input signal $B_{k+1}$ (e.g. input on a respective line 10f), the corresponding (backward) output signal of the next element (e.g., the (k+1)-th element 1b) is used.

Hence, the elements 1a, 1b, 1c, 1d, etc. together form a respective mirror delay chain 17 (mirror delay circuit 17).

The clock distortion detector 12, as shown in FIG. 2, might be comprised by (or connected with) a respective semi-conductor component, e.g. a memory component such as a RAM, in particular, a DRAM (e.g., a DDR-DRAM).

On this component, the above clock signals CLK and BCLK might be used to co-ordinate the processing and/or relaying of data.

The above clock signals CLK, BCLK preferably are differential, inverse clock signals.

Figure 3:
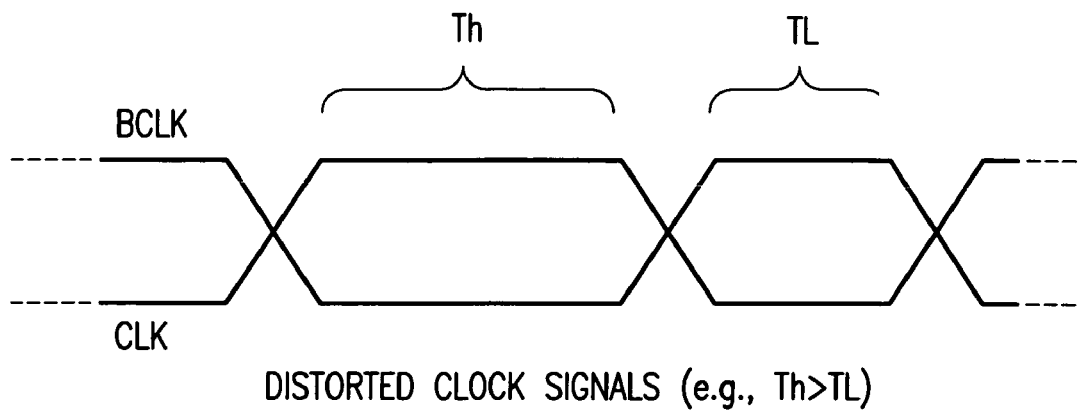
FIG. 3 is a timing diagramm showing—distorted—differential clock signals.

As is shown in FIG. 3, each time when the first of the two clock signals (e.g., the clock signal CLK) changes e.g. from a logic "high" state (e.g. a high voltage level) to e.g. a logic "low" state (e.g. a low voltage level), the second clock signal BCLK—essentially simultaneously—changes its state from logic "low" to logic "high" (e.g. from a low to a high voltage level).

Conversely, whenever the first clock signal CLK changes from a logic "low" state (e.g. from a low voltage level) to a logic "high" state (e.g. a high voltage level), the second clock signal BCLK (again essentially simultaneously)

changes its state from logic "high" to logic "low" (e.g. from a high to a low voltage level).

In the above component, data may be processed/relayed both at respective rising, and at respective falling edges of the clock signals CLK, BCLK (or DQS-/BDQS-signals derived therefrom, see below), leading to relatively high data rate rates.

The above differential clock signals CLK, BCLK might be generated by a respective—external—clock generating device, and then transmitted to the above semi-conductor component, in particular, the clock distortion detector 12 shown in FIG. 2.

Hence,—as is shown in FIG. 3—they might be distorted (e.g., the time Th the CLK signal—when received by the respective component, e.g. DRAM/DDR-DRAM—is logic "high" (and the BCLK signal is logic "low") might be longer than the time T1 the CLK signal is logic "low" (and the BCLK signal is logic "high"), or the other way round ("clock distortion") The clock distortion detector 12 as shown in FIG. 2 might be used to detect whether the clock signals CLK, BCLK are distorted or not, in particular, whether Th is bigger than T1, or smaller (and how much the difference between Th and T1 really is).

As is shown in FIG. 2, the above clock signal CLK—via a common clock line 14—is applied to the respective "forward" control signal lines 10c of all of the above synchronous mirror delay elements 1a, 1b, 1c, 1d of the clock distortion detector 12 (i.e., is used as the above "forward" control signal FW for the synchronous mirror delay elements 1a, 1b, 1c, 1d).

Further, as is shown in FIG. 2 also, the above inverse clock signal BCLK—via a further common clock line 15—is applied to the respective "backward" control signal lines 10m of the above synchronous mirror delay elements 1a, 1b, 1c, 1d of the clock distortion detector 12 (i.e., is used as the above "backward" control signal BW for the synchronous mirror delay elements 1a, 1b, 1c, 1d).

Figure 4:
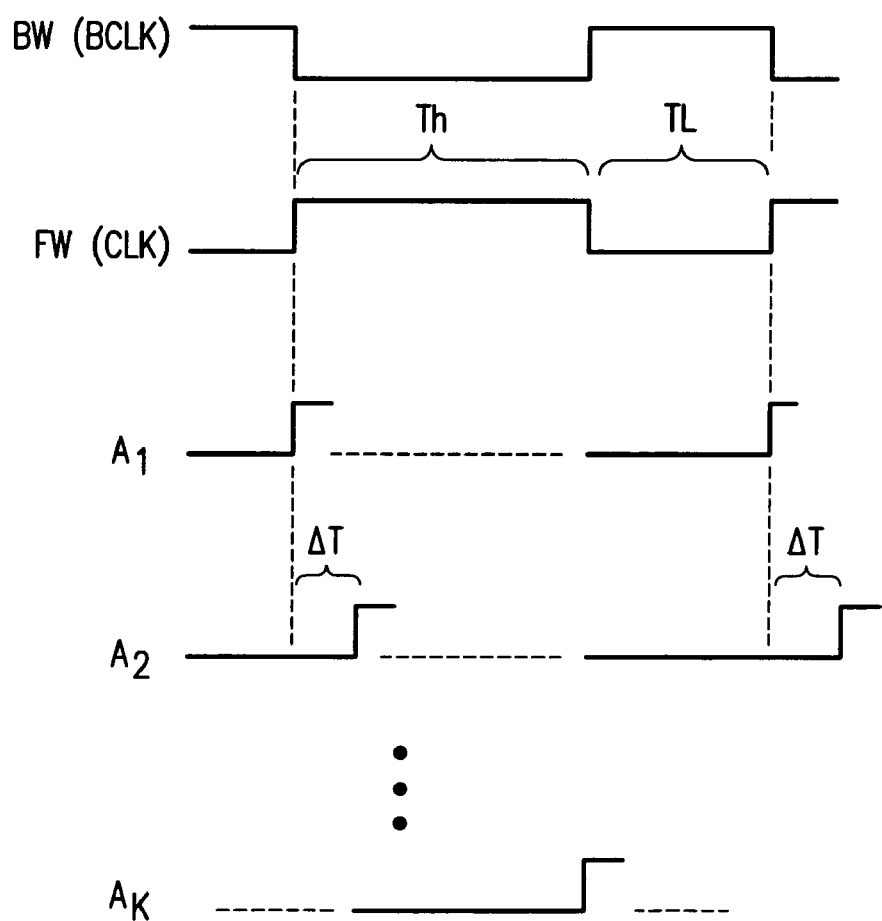
FIG. 4 is a timing diagram showing signals fed to and occuring in the clock distortion detector of FIG. 2.

In addition (as is shown in FIG. 4, and FIG. 2)—as a "test" signal—a short pulse signal $A_1$ is input into the respective (forward) input line 10n of the first synchronous mirror delay element 1d, which e.g. is output by a respective test control device 16. As can be seen from FIG. 4, the pulse signal $A_1$ input into the first synchronous mirror delay element 1d-whenever the clock signal CLK (i.e., the FW-signal) has a rising edge (i.e., changes from logic "low" to logic "high")—has a rising edge, also (i.e., changes its state from logic "low" to logic "high" substantially the same time as the CLK- (FW-signal).

Alternatively, the rising edge of the pulse signal $A_1$ might be set—e.g. by the control device 16—to occur later, than the rising edge of the clock signal CLK (i.e., there might be a predetermined, volitional, known delay between the rising edge of the pulse signal $A_1$, and the rising edge of the clock signal CLK (this delay, of course, has to be taken into account when—by the below procedure—it is determined whether or not there is a distortion, and/or whether Th is bigger than T1, or whether Th is smaller than T1 (see below))).

In a further alternative embodiment, instead of a separate "test" signal $A_1$ output by the control device 16, the clock signal CLK itself might be input into the respective (forward) input line 10n of the first synchronous mirror delay element 1d (i.e., might be used as "test" signal) (see dashed line 10p shown in FIG. 2).

In an alternative embodiment, every second (or third, etc.) clock signal CLK might be be input into the respective (forward) input line 10n (i.e., the below clock distortion determination procedure—instead of once a cycle—might instead only be carried out every second (or third, fourth, etc.) cycle).

As can be seen from FIG. 4, the "test" signal $A_1$ present on the (input) line 10n of the first synchronous mirror delay element 1d—as long as the signal CLK (i.e., the FW-signal) is "logic high"—propagates in a forward direction from one synchronous mirror delay element to the other (i.e., from the first synchronous mirror delay element 1d to the second synchronous mirror delay element 1c, then to the next synchronous mirror delay element, etc.) (such that,—after a certain delay $\Delta T$ (see e.g. as well FIG. 4)—the positive edge of the "test" signal $A_1$ applied to the first synchronous mirror delay element 1d leads to a corresponding positive edge of the (forward) output signal $A_2$ of the first synchronous mirror delay element 1d (used as (forward) input signal $A_2$ for the second synchronous mirror delay element 1c, such that—again after the above delay $\Delta T$—the (forward) output signal $A_3$ of the second synchronous mirror delay element 1d also has a positive edge, etc.)).

The longer the signal CLK (i.e., the FW-signal) is "logic high" (i.e., the longer the above time Th), the more subsequent synchronous mirror delay elements will—in a forward direction—be propagated.

As soon as the signal CLK (i.e., the FW-signal) changes its state from "logic high", to "logic low", and the signal BCLK (i.e., the BW-signal)—inversely—from "logic low", to "logic high", the clock distortion detector's signal propagation direction is changed.

Then, the above signal $A_1$ (in particular, the above positive edge (which might have e.g. reached the k-th mirror delay element 1a, see e.g. the respective input signal $A_k$ as shown in FIG. 4)) is no longer propagated in a forward direction.

Instead, respective, corresponding (backward) signals $B_k$, $B_{k+1}$—in particular, respective, corresponding positive edges—(present at the respective (backward) input lines of the synchronous mirror delay elements) then are propagated—in a backward direction—towards the first synchronous mirror delay element 1d.

In other words, as long as the signal CLK (i.e., the FW-signal) is "logic low", and the signal BCLK (i.e., the BW-signal) is "logic high", the corresponding input signal present on the (input) line of the respective (e.g. k-th) synchronous mirror delay element 1a propagates in a backward direction from one synchronous mirror delay element to the other (i.e., from the respective, e.g. k-th synchronous mirror delay element 1a to the previous synchronous mirror delay element, etc. (such that,—again after the above delay $\Delta T$—the positive edge of the respective backward input signal leads to a corresponding positive edge of the backward input signal of the previous synchronous mirror delay element, etc., etc.)).

The longer the signal CLK (i.e., the FW-signal) is "logic low", and the signal BCLK (i.e., the BW-signal) is "logic high" (i.e., the longer the above time T1), the more subsequent synchronous mirror delay elements will—in a backward direction—be propagated.

As soon as the signal CLK (i.e., the FW-signal) again changes its state from "logic low", to "logic high", and the signal BCLK (i.e., the BW-signal)—inversely—from "logic high", to "logic low", the clock distortion detector's signal propagation direction is changed, such that the above signals $B_K$, $B_{K-1}$, etc. (in particular, the respective positive edges) are no longer propagated in a backward direction.

If the respective signal $B_K$, $B_{K-1}$, etc. (in particular, the respective positive edge thereof) reaches the first mirror delay element 1*d* (in particular, the respective backward output line 10*o*, see e.g. the signal B₁ as shown in FIG. 2) substantially at the same time that a new "test" pulse signal A₁ is applied by e.g. the above test control device 16 to the respective forward input line 10*n*, or at the same time a new rising edge of the CLK signal occurs, the above time Th during which the CLK signal is "logic high" (and the BCLK signal is "logic low") essentially is the same as the above time T1 during which the BCLK signal is "logic high" (and the CLK signal is "logic low"), i.e. Th≅T1.

In this case, the clock signals CLK, BCLK are—essentially—not distorted.

The test whether the respective (backward) signal (e.g., the signal B₁) reaches the first mirror delay element 1*d* substantially at the same time that a new "test" pulse signal A₁ is applied to the first mirror delay element 1*d*, or at the same time a new rising edge of the CLK signal occurs, might e.g. be performed by the above test control device 16, e.g. by a respective edge detector comprised therein.

If, instead, Th e.g. is smaller than T1 (i.e., Th<T1), the respective (backward) signal (e.g., the signal B₁)—in particular, the above rising edge thereof—reaches the first mirror delay element 1*d* before a new "test" pulse signal A₁/a new clock signal CLK is applied to the first mirror delay element 1*d* (in particular, before the next rising edge thereof), as—again—might be detected by the edge detector, etc.

By determining the time difference between the—next—"test" pulse signal A₁/CLK signal applied to the first mirror delay element 1*d* (in particular, the next rising edge thereof), and the (rising edge of the)—backward—signal B₁ caused by the (previous) "test" pulse signal A₁ (again e.g. through the test control device, and the respective edge detector), the amount of distortion of the CLK-/BCLK-signals might be determined.

If, instead, Th e.g. is bigger than T1 (i.e., Th>T1), the respective (backward) signal (e.g., the signal B₁)—in particular, the above rising edge thereof—does not reach the first mirror delay element 1*d* before a new "test" pulse signal A₁/CLK signal is applied to the first mirror delay element 1*d* (in particular, before the next rising edge thereof), as—again—might be detected by the edge detector, etc.

Hence, by detecting whether or not the respective backward signal B₁ reaches the first mirror delay element 1*d* before or after a new "test" pulse signal A₁/CLK signal is applied to the first mirror delay element 1*d*, it might be detected whether Th is smaller than T1, or Th is bigger than T1.

Depending on the results of the above clock distortion detection method, respective—undistorted—signals CLK', BCLK' might be generated from the above—possibly distorted—signals CLK, BCLK, and might e.g. be fed to a respective DLL-circuit (DLL=Delay Locked Loop) comprised in the above component, e.g. DRAM, DDR-DRAM, etc.

The DLL-circuit—from the (undistorted) signals CLK', BCLK' applied thereto—generates the respective—internal—clock signal(s) DQS (or DQS/BDQS) ("data strobe" signal(s)).

By use of the DLL-circuit the—internally used—DQS-/BDQS-signals are synchronized with the above—corrected, undistorted—CLK'-/BCLK'-Signals (such that, e.g., the falling and rising edges of the DQS-/BDQS-Signals provided by the DLL-circuit occur at the same time as respective falling and rising edges of the above CLK'-/BCLK'-Signals).

While examplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention, without departing from the scope and spirit of the invention as defined by the appended claims.

What is claimed is:

1. A clock distortion detector, comprising:
an input for receiving a second clock signal;
a second input for recieving a second clock signal;
a first mirror delay element comprising at least one input, at least one output, and at least one control input;
and a second mirror delay element comprising at least one input, at least one output, and at least one control input, wherein the output of the first mirror delay element is coupled to the input of the second mirror delay element, and the output of the second mirror delay element is coupled to the input of the first mirror delay element, and the control input of the first mirror delay element and the control input of the second mirror delay are coupled to the input of the clock distortion detector for receiving the first signal.

2. The clock distortion detector of claim 1, wherein the first and the second mirror delay elements are synchronous mirror delay elements.

3. The clock distortion detector of claim 1, wherein the first and the second mirror delay elements each additionally comprises two control inputs.

4. The clock distortion detector of claim 3, wherein the first clock signal is fed to the respective first control inputs, and the second clock signal is fed to the respective second control inputs.

5. The clock distortion detector of claim 4, wherein the first and the second mirror delay elements are synchronous mirror delay elements.

6. The clock distortion detector of claim 1, further comprising a test device coupled to the input of the first mirror delay element.

7. The clock distortion detector of claim 6, wherein the test device additionally is coupled to the output of the first mirror delay element.

8. The clock distortion detector of claim 7, wherein the test device is configured to compare a signal input into the input of the first mirror delay element with the signal output at the first output of the first mirror delay element.

9. A clock distortion detection method, comprising:
applying a clock signal to a control input of a first mirror delay element; and
applying the clock signal to a control input of a second mirror delay element,
wherein a signal output by the first mirror delay element is applied to the second mirror delay element, and
a signal output by the second mirror delay element is applied to the first mirror delay element.

10. A clock distortion detector, comprising:
a first input for receiving a first clock signal;
a second input for receiving a second clock signal;
at least one mirror delay element;
a first mirror delay element, comprising two inputs and two outputs; and
a second mirror delay element, comprising two inputs and two outputs,
wherein a second output of the first mirror delay element is coupled with a first input of the second mirror delay element, and
a first output of the second mirror delay element is coupled with a second input of the first mirror delay element.

11. The clock distortion detector of claim 10, wherein the first and the second mirror delay elements are synchronous mirror delay elements.

12. The clock distortion detector of claim 10, wherein the first and the second mirror delay elements each additionally comprise two control inputs.

13. The clock distortion detector of claim 12, wherein the first clock signal is fed to the respective first control inputs, and the second clock signal is fed to the respective second control inputs.

14. The clock distortion detector of claim 13, wherein the first and the second mirror delay elements are synchronous mirror delay elements.

15. The clock distortion detector of claim 10, further comprising a test device coupled to a first input of the first mirror delay element.

16. The clock distortion detector of claim 15, wherein the test device additionally is coupled to a first output of the first mirror delay element.

17. The clock distortion detector of claim 16, wherein the test device is configured to compare a signal input into the input of the first mirror delay element with the signal output at the first output of the first mirror delay element.

* * * * *

UNITED STATES PATENT AND TRADEMARK OFFICE
CERTIFICATE OF CORRECTION

| | | |
|---|---|---|
| PATENT NO. | : 7,113,010 B2 | Page 1 of 1 |
| APPLICATION NO. | : 10/809826 | |
| DATED | : September 26, 2006 | |
| INVENTOR(S) | : Alessandro Minzoni | |

It is certified that error appears in the above-identified patent and that said Letters Patent is hereby corrected as shown below:

In Claim 1, Column 8, line 9, delete "second" and replace with --first--

Signed and Sealed this

Twenty-third Day of January, 2007

JON W. DUDAS
*Director of the United States Patent and Trademark Office*